United States Patent
Bernstein et al.

(10) Patent No.: US 7,521,950 B2
(45) Date of Patent: Apr. 21, 2009

(54) WAFER LEVEL I/O TEST AND REPAIR ENABLED BY I/O LAYER

(75) Inventors: Kerry Bernstein, Underhill, VT (US); Paul Coteus, Yorktown, NY (US); Ibrahim M. Elfadel, Ossining, NY (US); Philip Emma, Danbury, CT (US); Daniel J. Friedman, Sleepy Hollow, NY (US); Ruchir Puri, Baldwin Place, NY (US); Mark B. Ritter, Sherman, CT (US); Jeannine Trewhella, Peekskill, NY (US); Albert M. Young, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 631 days.

(21) Appl. No.: 11/163,167

(22) Filed: Oct. 7, 2005

(65) Prior Publication Data

US 2007/0081410 A1    Apr. 12, 2007

(51) Int. Cl.
  *G01R 31/02* (2006.01)
  *G01R 31/26* (2006.01)
  *G01R 31/28* (2006.01)
  *G01R 31/00* (2006.01)
  *G01N 37/00* (2006.01)
  *G06F 13/20* (2006.01)
  *G06F 13/36* (2006.01)
  *G06F 11/00* (2006.01)

(52) U.S. Cl. .................. 324/763; 324/765; 324/158.1; 438/14; 438/18; 702/58; 702/81; 702/118; 710/305; 710/306; 714/30; 714/738

(58) Field of Classification Search .................. 324/763, 324/765, 158.1; 438/14–18; 702/58, 81, 702/118; 710/305, 306; 714/25, 30, 43, 714/733, 738, 742
See application file for complete search history.

(56) References Cited

U.S. PATENT DOCUMENTS

| | | | |
|---|---|---|---|
| 5,834,162 A | 11/1998 | Malba | |
| 5,909,559 A | 6/1999 | So | |
| 6,105,119 A | 8/2000 | Kerr et al. | |
| 6,130,674 A | 10/2000 | Vaswani et al. | |
| 6,179,489 B1 | 1/2001 | So et al. | |
| 6,593,624 B2 | 7/2003 | Walker | |
| 6,645,832 B2 * | 11/2003 | Kim et al. | 438/456 |
| 6,661,085 B2 | 12/2003 | Kellar et al. | |
| 6,737,675 B2 | 5/2004 | Patel et al. | |
| 6,762,076 B2 | 7/2004 | Kim et al. | |
| 6,841,813 B2 | 1/2005 | Walker et al. | |
| 6,881,994 B2 | 4/2005 | Lee et al. | |
| 6,887,769 B2 | 5/2005 | Kellar et al. | |
| 6,888,750 B2 | 5/2005 | Walker et al. | |
| 2008/0253085 A1 * | 10/2008 | Soffer | 361/687 |

* cited by examiner

*Primary Examiner*—Ha Tran T Nguyen
*Assistant Examiner*—Karen M Kusumakar
(74) *Attorney, Agent, or Firm*—Whitham, Curtis, Christofferson & Cook, PC; Joseph P. Abate

(57) ABSTRACT

A 3D chip having at least one I/O layer connected to other 3D chip layers by a vertical bus such that the I/O layer(s) may accommodate protection and off-chip device drive circuits, customization circuits, translation circuits, conversions circuits and/or built-in self-test circuits capable of comprehensive chip or wafer level testing wherein the I/O layers function as a testhead. Substitution of I/O circuits or structures may be performed using E-fuses or the like responsive to such testing.

5 Claims, 6 Drawing Sheets

WAFER LEVEL I/O TEST AND REPAIR ENABLED BY I/O LAYER

STATEMENT OF GOVERNMENT INTEREST

This invention was made with Government support under DARPA Contract N66001-04-C-8032 awarded by SPAWAR Systems Center, San Diego. The Government has certain rights in this invention.

BACKGROUND OF THE INVENTION

1. Field of the Invention

The present invention generally relates to semiconductor integrated circuits and, more particularly to integrated circuits having a three-dimensional (3-D) structural configuration including a plurality of semiconductor circuit layers.

2. Description of the Prior Art

It has long been recognized that increased proximity between elements and circuits in electronic devices has numerous benefits in terms of cost, performance and functionality, particularly in complex digital processing circuits integrated on one or more semiconductor chips. Increased proximity of elements allows more devices and circuits to be formed on a single chip using a given process sequence, reducing cost of manufacture per circuit element while increasing functionality of a single chip. Increased proximity of elements on a chip and increased proximity of chips reduces connection length and capacitance and thus improves noise immunity, reduces signal propagation time and improves fan-out (the number of inputs to other circuits that a given circuit can drive). Further, proximity of elements on a chip can be increased as the size of individual elements is reduced, allowing more circuits having more diverse functions to be placed on a chip of given area.

However, the types of circuits which can be included on a single chip may be limited by the technologies required for different types of circuits. For example, the technologies preferred for logic circuits and high density memory circuits are sufficiently different that significant compromises must generally be made in regard to one or both types of circuits in order to fabricate both types of circuit on a single chip.

The combination of these advantages has driven the design of integrated circuit chips to increased integration density and the design of integrated circuit packaging to designs providing increased proximity of chips where a plurality of chips are included in a single package (which provides the added advantage of reducing cost of installing chip packages in various electronic devices since the number of chip packages is reduced for a given device by including a plurality of chips in a single package). However, each input/output (I/O) connection on each chip must include circuitry capable of driving or receiving an off-chip input to another chip. Off-chip signals must be significantly different from on-chip signals in order to maintain noise immunity and freedom from corruption of signals coupled from neighboring connections of relatively greater average length.

One of the more successful and potentially advantageous multi-chip package configurations has been the so-called chip stack where a plurality of individual chips are stacked, connections made directly between the chips and the chip stack packaged as a unit. In such a configuration, connection length between chips is minimized and many circuit topologies are made possible which are not conveniently available on a single, planar (e.g. 2-D) chip, even using complex multi-layer metallization layers to form connections on the chip. Further, chips fabricated using different technologies which would be incompatible on a single chip may be stacked and packaged together as a single unit.

Regardless of the theoretical potential advantages of such chip stack configurations, several highly intractable and interrelated problems have been encountered in practice which have grown even more intractable as reduced minimum feature size regimes and increased integration density for individual chips have developed to support extreme clock cycle speeds. For example, increased chip complexity generally implies an increased number of I/O connections to and from the chip which, in turn, implies a reduced size and increased proximity of I/O connections. Reduced size of I/O connections has several implications such as difficulty of making reliable connections between stacked chips or placement of probes for testing at the wafer or chip level (since the registration tolerance of the testing probe with the chip must be less than the connection pad size/pitch while the connection pad size and spacing must be severely limited to accommodate the number of connections required by increased chip complexity and while increased proximity of I/O connections increases signal coupling).

Moreover, increased integration density and reduction of circuit element size requires more stringent protection of internal chip circuits from overvoltage, electrostatic discharge (ESD) and the like at points where I/O connections are made. Additionally, broadband impedance matching circuits such as a T-coil device requiring a planar inductor may be needed and which may require substantial chip area, especially when replicated for each I/O connection. That is, the extra load presented by the introduction of ESD structures makes it more likely that additional impedance matching circuits may be needed to assure proper electrical behavior at the I/O and such impedance matching circuits typically include a planar inductor that may require substantial area. Such protection and impedance matching circuits must be provided in addition to circuits capable of providing signals suitable for off-chip device drive and, with increasing likelihood, signal level conversion, clock signal conversion and buffering circuits, consuming further chip area.

At the same time, increased chip complexity increases the need for testing at the chip level since a chip stack will be defective if any single chip included therein contains a defect while increased proximity of connection pads coupled with the fact that a chip stack remains a packaging configuration for individual chips and I/O circuits capable of driving off-chip circuits must be provided for each connection pad increases the likelihood of signal coupling between neighboring connections to each chip. Further, as increased integration density has allowed higher clock cycle rates reaching into the Gigahertz range, signal capture and analysis using external testers has become much more difficult, partly due to the size thereof, while more extensive tests are required by increased chip complexity that are correspondingly less well accommodated by test arrangements that can be provided in stringently limited area on the chip itself. Moreover, the extreme clock cycle speeds now possible require routing of signals from outputs of the chip to inputs of the chip over very short but wide (e.g. four bytes or more) bus or with buffering or latching arrangements (e.g. to limit effects of signal propagation time on the test results) which interfere with core logic layout. Thus the provision of more numerous circuits capable of providing protection, off-chip level drive and various needed signal conversions as well as routing has become increasingly expensive and impractical while testing has become much more expensive and impractical even in the face of increased need therefor.

In this latter regard, in addition to the practical problem of probing more densely integrated circuits having necessarily reduced connection pad dimensions alluded to above, the capture and isolation of a signal of interest in the Gigahertz range using an external tester presents such extreme difficulties that an external tester capable of doing so may cost several hundreds of thousands of dollars per I/O connection or pin. At the same time, testing at such frequencies has implications on chip design and layout and proximity of related input and output connections (e.g. providing an on-chip wrap bus to wrap the outputs to inputs which may interfere with core logic functions) which are difficult to meet and which engender other complications of signal capture and isolation, particularly at off-chip drive signal levels.

In addition to testing of chips during integrated circuit manufacture, it is desirable to periodically test a chip for functionality after the chip is placed in service (e.g. at power-up of the chip). For this purpose, so-called built-in self-test (BIST) arrangements have been developed and at the present state of the art are quite sophisticated. However, BIST arrangements, by their nature, impose a trade-off between the extent of testing that can be done, the amount of time which can be allotted to a self-test procedure and the amount of chip space that can be allocated to the BIST arrangement, particularly since the BIST arrangement must provide for generation (e.g. generally from storage) for the bit patterns which will be used to exercise the circuit and the bit patterns against which the result from a test bit pattern is to be compared to confirm functionality. Therefore, the chip area allocated to the BIST arrangement is generally limited to about two percent of the chip area and the extent of testing available is usually severely limited and reliance of external testers is generally required to confirm full functionality of a chip. Furthermore, BIST arrangements are used only in the digital part of the integrated circuit chip, which might also include analog functions as well such as receivers or transmitters or mixed-signal digital/analog functions, such as converters, for which different isolation strategies and testing structures are needed.

Therefore, particularly in view of the need for larger and more complex protection circuits at I/O connections and the need for providing testing at the chip or wafer level in order to avoid the much increased costs of later-discovered defects in individual chips after chip stacks have been formed, there has been no practical alternative to simply omitting chip and wafer level testing altogether and accepting the increased costs of rejecting substantially completed multi-chip packages during testing at the package or system level. Moreover, known techniques of chip stacking cannot, at practical costs, support current and foreseeable chip technologies and integration densities while already severely compromising the benefits which could potentially be derived from currently possible technologies and integration densities due to the cost of providing suitable I/O protection and off-chip drive signal levels at I/O connections between chips, even when commonly packaged.

This latter problem is particularly aggravated in regard to application specific integrated circuits (ASICs) which, as a practical matter, are generally designed using so-called cores or macros which are pre-designed functional circuit portions which can be laid out and connected on a single chip to provide, in the aggregate, a customized function which must often include circuits and connections for converting standard bus designs of existing cores to a customized bus configuration, often provided as a separate so-called bridge chip. As ASIC designs become more complex and higher performance levels are required, it would be desirable, particularly from the standpoints of manufacturing cost and potential performance improvement, to utilize a chip stack configuration for ASICs with individual cores or small groups of cores on separate chips. Such a configuration would enable better design re-use, faster time to market and quick customization of a design as well as the performance benefits alluded to above. However, as noted above, each chip must then include I/O connections including circuit protection and circuits capable of providing off-chip level drive signals. In practical effect, such a provision would amount to providing interfaces between virtually all cores in addition to the cores themselves (and any bus conversion chip included in the ASIC) and would be of prohibitive cost.

In summary, while it is seen that the above problems with common packaging of multiple chips, and chip stacks in particular, derive from the fact that each chip must be regarded as an off-chip device relative to every other chip and a suitable inter-chip interface provided while the requirements for each connection of each such interface have become more complex and stringent and consume increased chip area for each of an increased number of connections to the point of becoming prohibitive. To solve this basic problem, a so-called three-dimensional chip has been developed including a vertical bus arrangement such that drive signals suitable for off-chip devices are not needed and the separately fabricated chips effectively and functionally become portions of the same chip folded over on itself with the physical configuration providing the same potential advantages of chip stack configurations. However, such a connection does not solve the more specific and intractable problems of bus design conversion, customization and translation, the provision of suitable protection and off-chip device drive or, especially, chip or wafer level testing to support current and foreseeable chip design and manufacturing technology and the advantages potentially available therefrom.

SUMMARY OF THE INVENTION

It is therefore an object of the present invention to provide a 3D chip having at least one I/O layer connected to other 3D chip layers by a vertical bus such that the I/O layer(s) may accommodate protection and off-chip device drive circuits, customization circuits, translation circuits, conversion circuits and/or built-in self-test circuits capable of comprehensive chip or wafer level testing of the I/O circuits on that layer.

In order to accomplish these and other objects of the invention, a 3-D chip is provided comprising a core structure, at least one I/O layer which is layered with the core structure, and a vertical bus connecting the core layer and the I/O layer(s), the I/O layer(s) including customization circuitry, translation/conversion circuitry, protection circuitry, and/or built-in self-test circuitry including at least one of a wrap bus, and a pipeline structure.

In accordance with another aspect of the invention, a method of wafer-level I/O test and repair in a 3-D chip is provided comprising the steps of locating I/O circuits and built-in self-test structures in an I/O layer of a 3D chip, connecting the I/O layer to the 3D chip core by a vertical bus, activating the built-in self-test structures, generating data patterns from the built-in self-test structures feeding the data patterns through a high-speed I/O transmit path, wrapping the data patterns from the high-speed I/O transmit path to I/O pins via a bus, analyzing the data patterns with data pattern analyzers.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
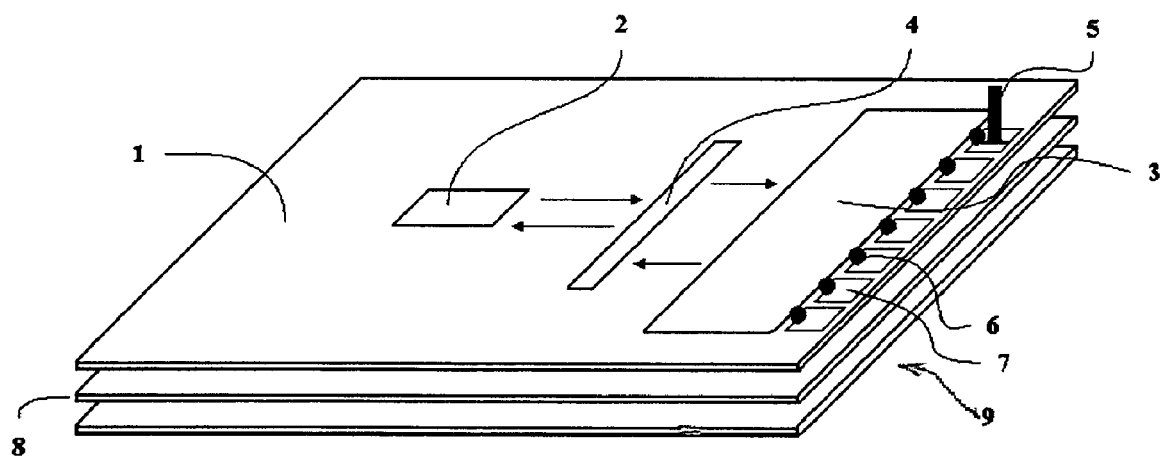
FIG. 1 is a drawing of an I/O layer of a 3D chip, wherein multiple components are located on the I/O chip layer.

Referring now to the drawings, and more particularly to FIG. 1, there is shown a separate chip layer in a 3-D chip wherein certain I/O components of the 3-D chip are located as contemplated by the present invention. The I/O layer 1 as shown is a separate chip layer (but which may, itself, be fabricated as a plurality of layers, such as separate layers for outputs/transmitters and inputs/receivers or bidirectional I/Os, respectively, particularly if of differing technologies or communication medium) connected to a 3-D chip 8 by a vertical bus 2, although the I/O layer 1 could be connected by a plurality of vertical or inter-layer buses. The core of the 3-D chip 9 includes and arbitrary number of layer(s) containing memory and processing functions as may be desired. Regardless of the number of layers or chips which may be included in each of I/O layer(s) 8 and core layer(s) 9, all layers or chips are similarly related in terms of structure, function and connectivity to the vertical bus or buses.

The I/O layer(s) 1 contains the input, output and/or bi-directional I/O macros 3, which are connected to pins 5 or wirebond pads or C4s 6 on the 3-D chip, and also electrostatic discharge structures 7. In some cases, an elastic FIFO register or voltage and clock domain translators 4 are used to bridge from I/O circuit clock and voltage domains to the vertical bus clock and voltage domains. The chip pins 5, C4s 6, or wirebond pads should be arranged such that minor changes in the number of I/O are easily accommodated, since some bus standards require additional error correction code or control information. However, this is not essential as the I/O layer(s) may be used to translate the pin/pad pattern between standard or custom package I/O patterns and between 3-D chip and first level packaging, as well. Thus, in the preferred embodiment, all of the logic and connections necessary for translation resides on at least one I/O layer, allowing for true modularity of the individual layers of the 3-D chip in accordance with the invention.

Locating I/O components on at least one separate chip layer allows designers to decouple I/O macro placement from the placement of core logic, such as processors and memory. This allows for more commonality of package I/O for standards based buses, and hence reduces cost and time-to-market for overall system design. Additionally, the separate I/O layer(s) allows for considerable flexibility in terms of customization. The I/O of a 3-D chip can be customized based on user requirements by modifying only I/O layer(s) 1 to meet user requirements, including but not limited to signal levels and clocking, protection, impedance matching, pin-out and packaging. Having an interchangeable I/O layer 1 allows for a designer to change the bus from a proprietary internal bus (e.g. PCI-Express, Infiniband, a custom bus configuration or the like) to, for example, a standards based bus in another technology (e.g. CMOS). For example, the layer could be customized for RF wireless or optical components as will be discussed below in connection with FIG. 3, in whatever technology is required for the end use.

Figure 2:
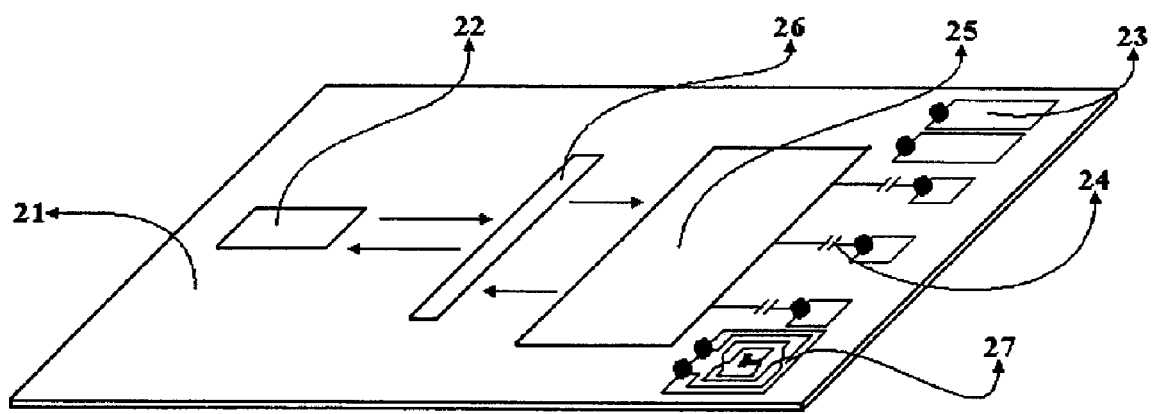
FIG. 2 is a drawing of an I/O chip layer wherein the I/O components have been modified to suit a user-defined environment without requiring changes to chip logic on other layers of the 3D chip.

Referring now to FIG. 2, which shows I/O components located on a separate layer of a 3-D chip having been modified to suit a user-defined environment without requiring changes to the core layer of the 3-D chip. Including I/O components on at least one separate layer from the core logic of a 3-D chip allows for customization of the I/O without modifying the core logic. The I/O layer 21 is connected to or in a 3-D chip by at least one vertical bus 22, as shown in FIG. 1 and discussed above. Larger, or different, ESD structures 23 and AC coupling capacitors or other impedance matching circuits 24, such as planar inductors, may be added to the I/O layer 21 without requiring changes to the layout of logic on other layers of the 3-D chip. The I/O layer(s) 21 continues to include I/O macros 25 and voltage and clock domain translators 26. In certain circumstances, it may be beneficial to place the ESD device(s) or other devices such as T-coils 27, on yet another I/O layer separate from (e.g. above or below in the chip stack) the main I/O layer 21. In general, it is preferred to place such protective and impedance matching circuits proximate to external connections such as pads, pins, C4s or the like which may dictate the order of stacking of chips. Alternatively, the connections to C4s, pins or I/O pads can run vertically; freeing chip area and reducing parasitic coupling effects between I/O connections and the ESD structures 23, improving overall device performance.

It can be advantageous to use multiple chip layers for I/O components when, for example, transmitters and receivers are in different technologies, or processed differently, making it difficult or burdensome to integrate into a single chip manufacturing process. Using multiple layers for I/O components in a 3-D chip allows for convenient integration of dissimilar technologies.

Figure 3:
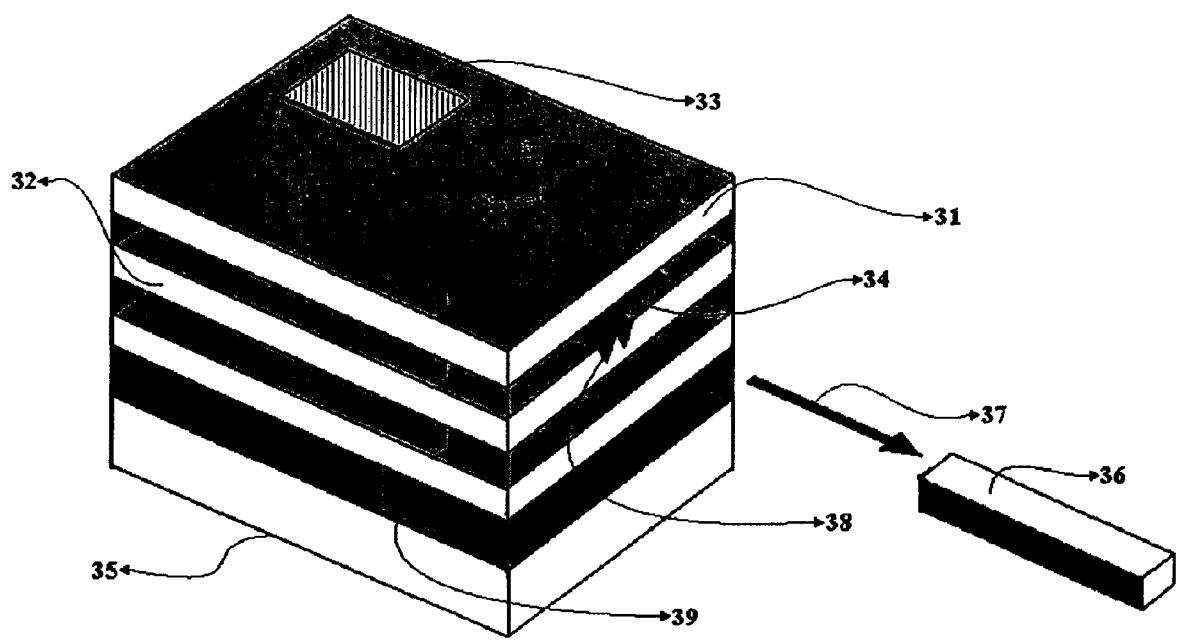
FIG. 3 is a drawing of a 3D chip in which the I/O receiving components are on a separate layer from the I/O transmitting components.

Referring now to FIG. 3, the I/O components of the 3-D chip do not need to be housed on one single layer. FIG. 3 shows one embodiment of the invention as also applied to an optical or radio frequency (RF) I/O, conversion therebetween or between either optical and/or RF I/O and electrical I/O or any combination thereof, wherein the I/O transmitting components are housed on a layer separate from the layer housing the I/O receiving components. For example, as illustrated in FIG. 3, the optical or RF I/O receiver chip layer 31 is separate from the optical transmitter chip layer 32. The I/O receiver chip layer 31 includes most, or all, components relevant to I/O receiving, such as the optical or RF receiver 33 which may include an integrated or discrete antenna, micro-machined waveguides or the like. Similarly, the I/O transmitter chip layer 32 includes most, or all, components relevant to I/O transmitting, such as a light-emitting unit 34 and structures 38 which allow energy coupling to a waveguide, antenna or the like. The I/O receiver chip layer 31 and I/O transmitter chip layer 32 are integrated into a 3-D chip 35 by means such as vertical buses or interlayer buses 39. Light or RF energy 37 transmitted from the I/O transmitter chip layer 32 by means of the light-emitting unit or RF transmitter 34 may be coupled to a fiber or plurality of fibers or other antenna or waveguide 36 positioned against or in close proximity to the I/O transmitter layer 32, and can be aligned with micromachined V-grooves or other structures which may be formed lithographically. Energy (e.g. light) received by the 3-D chip 35 falls on the optical or RF receiver 33. If ridge-waveguide receivers are used as the optical receiver 33, then both the I/O receiver layer 31 and the I/O transmitter layer 32 could be coupled to waveguides or fibers around the periphery of the 3D chip 35, yet remain separate layers.

Figure 4:
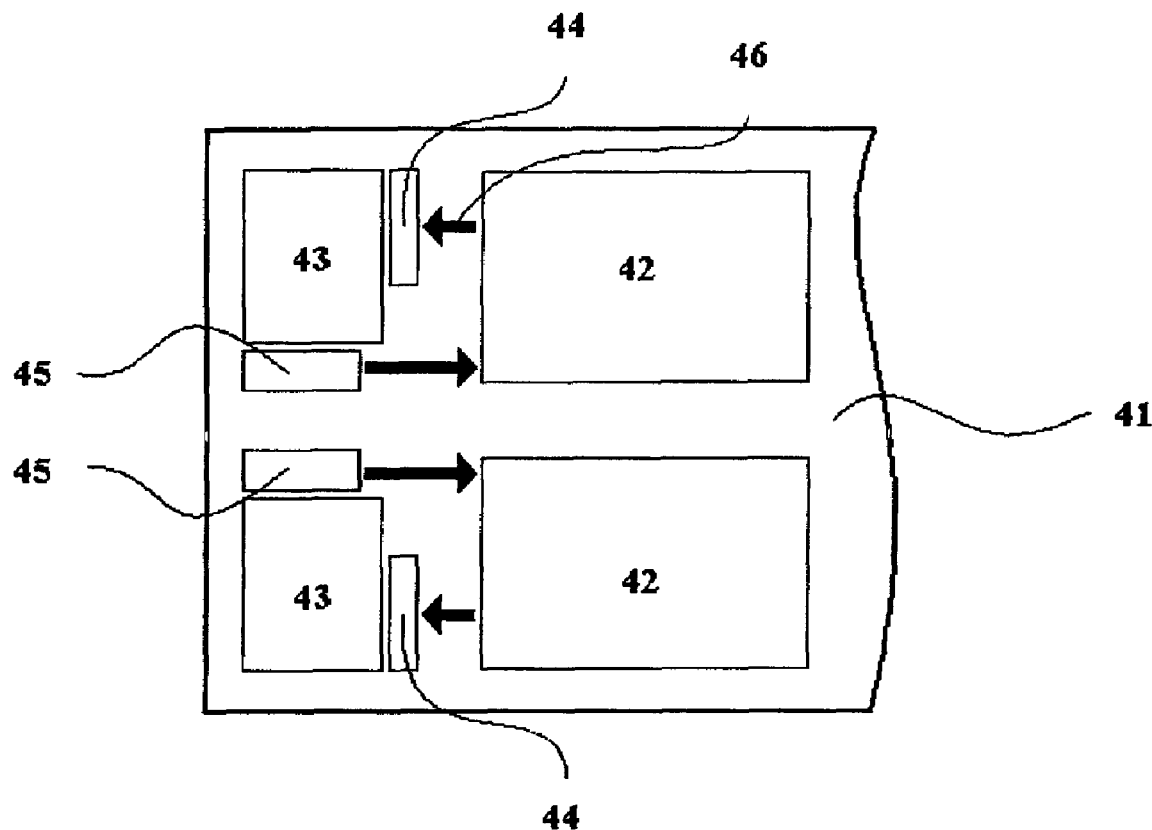
FIG. 4 is a drawing of current 2D chip design for I/O buses showing location of receiving and transmitting buses relative to other local circuitry.

Referring now to FIG. 4, I/O buses on processors are very wide (from four to eight bytes wide per bus), making it very difficult to implement full at-speed wrap testing in a 2-D chip, especially a pipelined wrap path which may be a very wide bus with active pipelining circuits. FIG. 4 shows a segment of a 2-D chip 41 having core logic 42 and memory components 43. In current 2-D chip practice, transmit buses 44 and receive buses 45 are usually separated to eliminate near-end crosstalk. This creates long wiring paths (many millimeters to about one centimeter in length) from transmitters to receivers for this bus wrap, and placing buffers or pipeline latches to wrap a high-speed bus is not possible in 2-D chips because of intervening logic, such as memory 43, and congested wiring 46. With a separate layer or layers housing the I/O components, however, there is no concern with intervening logic or wiring as will be explained in connection with FIG. 5.

Figure 5:
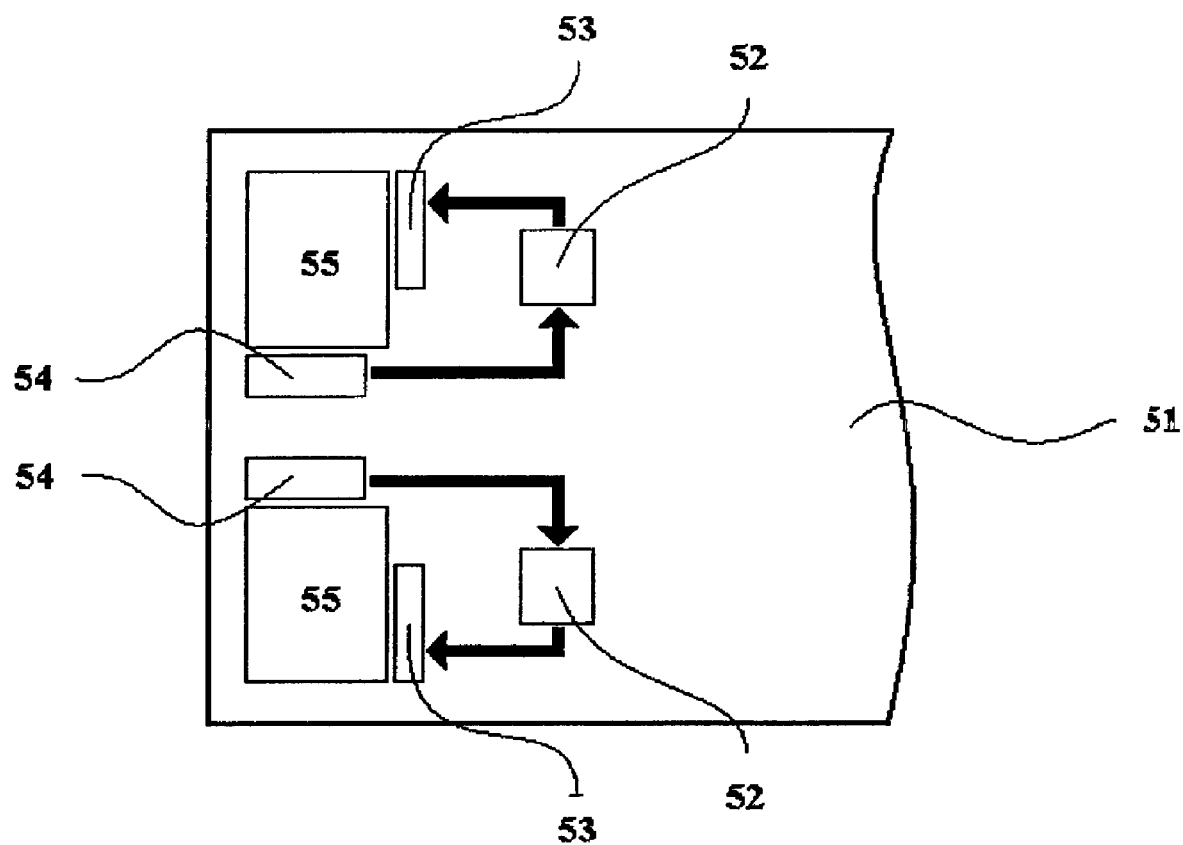
FIG. 5 is a drawing of a separate I/O layer in a 3D chip showing location of receiving and transmitting buses relative to other local circuitry.

A separate layer or layers for I/O components in a 3-D chip according to the invention is ideal for various data wraps from the transmit side to the receive side of a bus interface for the purpose of determining the functionality of each I/O in a bus in parallel, at speed, and at wafer level or in a system test. FIG. 5 shows a segment of a layer 51 in a 3-D chip, separate from the layer containing core logic, wherein certain BIST structures are built. The separate layer 51 is connected to at least one other layer of the 3-D chip by at least one vertical, on-chip bus 52. Transmit buses 53 and receive buses 54 are connected to pipelining latches and other necessary logic 55. This allows for more chip area to place I/O wrap circuitry and clocks to support wafer-level and at-speed testing without interfering with other circuits, especially the core logic.

Further, allocating a separate chip layer or layers for I/O functions in a 3-D chip also allows for creation of test structures for I/O bus wraps not possible in 2-D chips. Building I/O components and BIST structures into at least one separate layer of a 3-D chip allow for on-wafer and at-speed I/O wrap testing performed independent of and separate from the chip core. During wafer test, the I/O layer can be isolated from the rest of the 3-D logic layers. Appropriate clocks and signals are applied to place the circuits in a self-test mode, and high-speed IO buses put in wrap modes.

Figure 6:
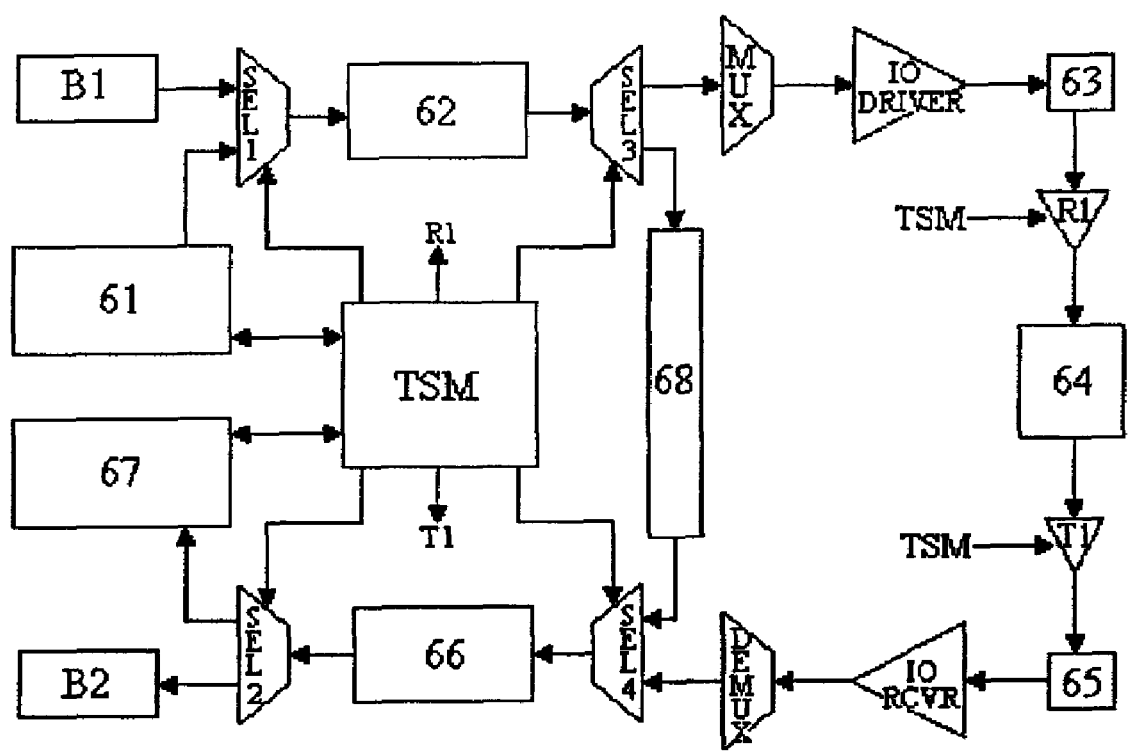
FIG. 6 is a high-level diagram of I/O and test structures built into an I/O layer for on-wafer and at-speed I/O wrap testing.

FIG. 6 is a high-level diagram of I/O and BIST structures built into a separate layer of a 3-D chip according to the invention. When the layer is put into at-speed, wafer-level test mode, the test state machine TSM, or a small processor or part of another processor incorporated into other layers of the 3-D chip, controls test operation and collects test results. TSM controls the pattern generator macro 61 to generate pseudo-random or pattern data, which is multiplexed into the transmit path logic circuits 62 by selector SEL 1. The data is then wrapped at full speed around I/O pad 63. A small receiver R1 is connected to I/O pad 63 to buffer the data and send it across the chip layer through the wrap path logic 64 to I/O pad 65. If the data rates are sufficiently high, on-chip wiring and standard-cell latches may not support the I/O data speed. In such cases, the wrap path may include an additional demultiplexer positioned just after R1, allowing data from each I/O to be transmitted in a parallel bus at lower speeds. If the data are demultiplexed, they must be multiplexed before entering the buffer T1 which drives I/O pad 65 of the receive path logic 66. Data then passes through the receive path logic 66, which may include a demultiplexer for high-speed I/O, and is finally routed by SEL 2 to the pattern checker macro 67. The pattern checker macro 67 tabulates errors on each lane of the bus, and these errors are reported to the TSM.

With the independent silicon or other semiconductor and wiring plane allowed by the I/O layer in 3-D chip stacks, one can also place wraps at other corresponding nodes in the transmit path 62 and the receive path 66. For example, the TSM can control SEL 3 to route test data from the pattern generator macro 61 passing through the transmit path 62 through pipeline 68 thereby foregoing multiplexing. Test data can then pass through the receive path 66, and back to the pattern checker macro 67, which tabulates errors on each lane of the bus and reports to the TSM. When testing is not in progress, all of the test logic can be powered down, so that no test clocks, buffers, and the like are operating, to save power.

These test wraps are effective for an I/O bus of any width, allowing each I/O channel to be tested separately and simultaneously with all the other I/O. This also allows high-throughput, at-speed wafer-level I/O functionality screening; I/O testing from the interface to the on-chip bus B1 or B2, which may be a vertical bus connecting the I/O layer to the other layers in the 3D chip to the I/O pad. In essence, by allocating the BIST to one or more of the I/O layers in accordance with the invention, the I/O layers can be used as a testhead and/or a high clock rate tester while avoiding problems of probe registration or signal capture or propagation time associated with an external tester and can provide testing core logic with any desired level of thoroughness or exhaustiveness at the wafer level to avoid loss manufacturing yield at the 3-D completed chip stack level. Additionally, this location of the BIST arrangement in the I/O layer(s) allows I/O bus repair if a faulty I/O channel is found. If the bus speeds are sufficiently low, a set of multiplexers can route data from the on-chip bus, through the good spare channel, to the appropriate I/O pin. Alternatively, spare I/O pins can be allocated for each bus. When a bad channel is found, data is multiplexed from the bad path to the good path afforded by the spare I/O channel. This multiplexing can be performed at the on-chip bus or at a point along the I/O channel. The configuration of the multiplexers for I/O channel repair can be set by E-fuses which are blown after wafer test. This allows chips to be shipped in a functional configuration, i.e. no need for bringup and test sequence in a system, which may be costly and time consuming. When a "repaired" chip with spare I/O is connected to another chip in a 3-D chip, initialization protocols can be used to configure the chip-to-chip bus to recognize that data has been routed to spare I/O.

There are many additional advantages to housing the I/O components in a separate layer or layers in a 3-D chip. Many I/O circuits require special clocking asynchronous from the core logic with a special clock domain. Placing wrap circuitry with pipelined latches requires running that special clock domain across the chip, which usually interferes with the clock domain of the core logic and results in competition for wiring resources and silicon space. Having a separate I/O layer decouples the clock domains physically, both in wiring and in silicon. Also, using a separate I/O layer allows pipeline latches and other support logic required for wrapping and testing to be independent of core logic placement.

While the invention has been described in terms of a single preferred embodiment, those skilled in the art will recognize that the invention can be practiced with modification within the spirit and scope of the appended claims.

What is claimed is:

1. A method of wafer-level I/O test and repair in a multi-layered 3-D chip, having at least one I/O layer and at least one core layer, comprising the steps of: locating I/O circuits and built-in-self-test structures in the I/O layer of the 3-D chip; connecting said I/O layer to the 3-D chip core layer by a vertical bus;
  activating said built-in self-test structures;
  generating data patterns from said built-in self-structures;
  feeding said data patterns through a high-speed I/O transmit path;
  wrapping said data patterns from said high-speed I/O transmit path to I/O pins via a bus;
  analyzing said data patterns with data patterns analyzers.

2. The method of claim 1, wherein upon finding a defective I/O, at least one spare I/O is positioned and activated such that data can be multiplexed around said defective I/O.

3. The method of claim 1, further comprising the step of hardwiring activated spare I/O.

4. The method of claim 3, wherein the step of hardwiring activated spare I/O is accomplished by the steps of:
  locating at least one e-fuse near an I/O such that, upon blowing of said e-fuse, said I/O will no longer be hardwired; and
  blowing said e-fuse upon finding said I/O to be defective.

5. The method of claim 1, further comprising the step of shutting off test circuitry while said chip layer is in functional mode.

* * * * *